United States Patent
Wyss et al.

(10) Patent No.: US 9,151,664 B2
(45) Date of Patent: Oct. 6, 2015

(54) SUBMOUNT FOR OPTOELECTRONIC, OPTICAL, OR PHOTONIC COMPONENTS

(75) Inventors: Rolf A. Wyss, Glendale, CA (US); Peter C. Sercel, Pasadena, CA (US)

(73) Assignee: HOYA Corporation USA, Milpitas, CA (US)

( * ) Notice: Subject to any disclaimer, the term of this patent is extended or adjusted under 35 U.S.C. 154(b) by 256 days.

(21) Appl. No.: 14/006,673

(22) PCT Filed: Aug. 3, 2012

(86) PCT No.: PCT/US2012/049650
§ 371 (c)(1),
(2), (4) Date: Sep. 22, 2013

(87) PCT Pub. No.: WO2014/021904
PCT Pub. Date: Feb. 6, 2014

(65) Prior Publication Data
US 2014/0239167 A1    Aug. 28, 2014

(51) Int. Cl.
| | |
|---|---|
| H01L 31/00 | (2006.01) |
| G01J 1/02 | (2006.01) |
| H01L 31/0232 | (2014.01) |
| G02B 27/14 | (2006.01) |
| G02B 6/36 | (2006.01) |
| G02B 6/42 | (2006.01) |
| G02B 7/00 | (2006.01) |

(52) U.S. Cl.
CPC ............. *G01J 1/0271* (2013.01); *G02B 6/4224* (2013.01); *G02B 27/14* (2013.01); *H01L 31/0232* (2013.01); *G02B 6/3692* (2013.01); *G02B 6/4214* (2013.01); *G02B 7/00* (2013.01)

(58) Field of Classification Search
CPC .................... H01L 31/0232; H01L 31/02327; H01L 31/0328
USPC .................... 250/214.1, 216; 385/88, 92, 129; 257/432, 433, 435
See application file for complete search history.

(56) References Cited

U.S. PATENT DOCUMENTS

| | | |
|---|---|---|
| 5,218,223 A | 6/1993 | Spaeth et al. |
| 5,344,746 A | 9/1994 | Vettiger et al. |
| 5,793,062 A | 8/1998 | Kish, Jr. et al. |
| 5,932,114 A | 8/1999 | Makiuchi |
| 5,999,670 A | 12/1999 | Yoshimura et al. |

(Continued)

FOREIGN PATENT DOCUMENTS

| | | |
|---|---|---|
| EP | 0 807 981 | 11/1997 |
| JP | 06-029566 | 2/1994 |

OTHER PUBLICATIONS

Bazylenko et al, Fabrication of Light-Turning Mirrors in Buried-Channel silica Waveguides for Monolithic and Hybrid Integration, Journal of Lightwave Technology, Jan. 1997, pp. 148-153, vol. 15, No. 1.

(Continued)

*Primary Examiner* — Kevin Pyo
(74) *Attorney, Agent, or Firm* — David S. Alavi

(57) ABSTRACT

An optical submount has a circumscribed 4-faced depression on its bottom surface and a 3-faced depression at an edge of its bottom surface. An optical signal is transmitted through a face of the 3-faced depression and internally reflected from a face of the 4-faced depression. A set of additional depressions and intervening areas on the submount bottom surface act as an alignment mark.

30 Claims, 15 Drawing Sheets

(56) References Cited

U.S. PATENT DOCUMENTS

| | | | |
|---|---|---|---|
| 6,108,472 | A | 8/2000 | Rickman et al. |
| 6,229,160 | B1 | 5/2001 | Krames et al. |
| 6,246,097 | B1 | 6/2001 | Kato et al. |
| 6,323,063 | B2 | 11/2001 | Krames et al. |
| 6,339,607 | B1 | 1/2002 | Jiang et al. |
| 6,353,250 | B1 | 3/2002 | Fukano |
| 6,570,190 | B2 | 5/2003 | Krames et al. |
| 6,617,568 | B1 | 9/2003 | Matsuda |
| 6,753,587 | B2 | 6/2004 | Furuya et al. |
| 6,768,136 | B2 | 7/2004 | Eisert et al. |
| 6,885,795 | B1 | 4/2005 | Hsu et al. |
| 6,921,956 | B2 | 7/2005 | Yang et al. |
| 6,992,276 | B2 | 1/2006 | Blauvelt et al. |
| 7,148,465 | B2 | 12/2006 | Blauvelt et al. |
| 7,714,369 | B2 * | 5/2010 | Okumura et al. ............. 257/292 |
| 2002/0122615 | A1 | 9/2002 | Painter et al. |
| 2002/0172459 | A1 | 11/2002 | Bailey et al. |
| 2003/0057443 | A1 | 3/2003 | Dietrich et al. |
| 2004/0188788 | A1 | 9/2004 | Yang et al. |

OTHER PUBLICATIONS

Bouadma et al, 1.3-um GaInAsP/InP Buried-Ridge-Structure Laser and its Monolithic Integration with Photodetector Using RI Beam Etching, Journal of Lightwave Technology, May 1994, pp. 742-748, vol. 12, No. 5.

Chao et al, Fresnel Analysis of Effective Mirror Reflectivity in Folded-Cavity In-Plane Surface-Emitting Lasers, IEEE Photonics Technology Letters, Apr. 1993, pp. 390-392, vol. 4, No. 4.

Fukano et al, A Low-Cost Edge-Illuminated Refracting-Facet Photodiode Module with Large Bandwidth and High Responsivity, Journal of Lightwave Technology, Jan. 2000, pp. 79-83, vol. 18, No. 1.

Fukano et al, High-Responsivity and Low-Operation-Voltage Edge-Illuminated Refracting-Facet Photodiodes with Large Alignment Tolerance, Journal of Lightwave Technology, May 1997, pp. 894-899, vol. 15, No. 5.

Fukano et al, Edge-illuminated refracting-facet photodiode with high responsivity and low-operation voltage, Electronics Letters, Dec. 5, 1996, pp. 2346-2348, vol. 32, No. 25.

Gfeller et al, 50 mW CW-Operated Single-Mode Surface-Emitting AlGaAs Lasers with 45 deg Total Reflection Mirrors, IEEE Photonics Technology Letters, Jul. 1992, pp. 698-700, vol. 4, No. 7.

Hilleringmann et al, Optoelectronic System Integration on Silicon:Waveguides, Photodetectors, and VLSI CMOS Circuits on One Chip, IEEE Transactions on Electron Devices, May 1995, pp. 841-846, vol. 42, No. 5.

Jones et al, Hybrid integration onto silicon motherboards with planar silica waveguides, IEE Proc. Optoelectron., Oct. 1996, pp. 316-321, vol. 143, No. 5.

Kato et al, Large Coupling Tolerance Side-Illuminated Mirror Photodiode for Low-Cost Surface Hybrid Integration, IEEE Photonics Technology Letters, Jun. 1999, pp. 709-711, vol. 11, No. 6.

Strandman et al, Fabrication of 45 deg Mirrors Together with Well-Defined V-Grooved Using Wet Anisotropic Etching of Silicon, Journal of Microelectromechanical Systems, Dec. 1995, pp. 213-219, vol. 4, No. 4.

Terui et al, Novel Micromirror for Vertical Optical Path Conversion Formed in Silica-Based PLC Using Wettability Control of Resin, Journal of Lightwave Technology, Sep. 1998, pp. 1631-1639, vol. 16, No. 9.

Zurhelle et al, Highly Efficient Waveguide-Detector Coupling Structures for Integrated Opto-Electronical Circuits on Silicon, Journal of Lightwave Technology, Mar. 1996, pp. 410-416, vol. 14, No. 3.

International Search Report and Written Opinion dated Feb. 25, 2013 for counterpart App. No. PCT/US2012/049650.

* cited by examiner

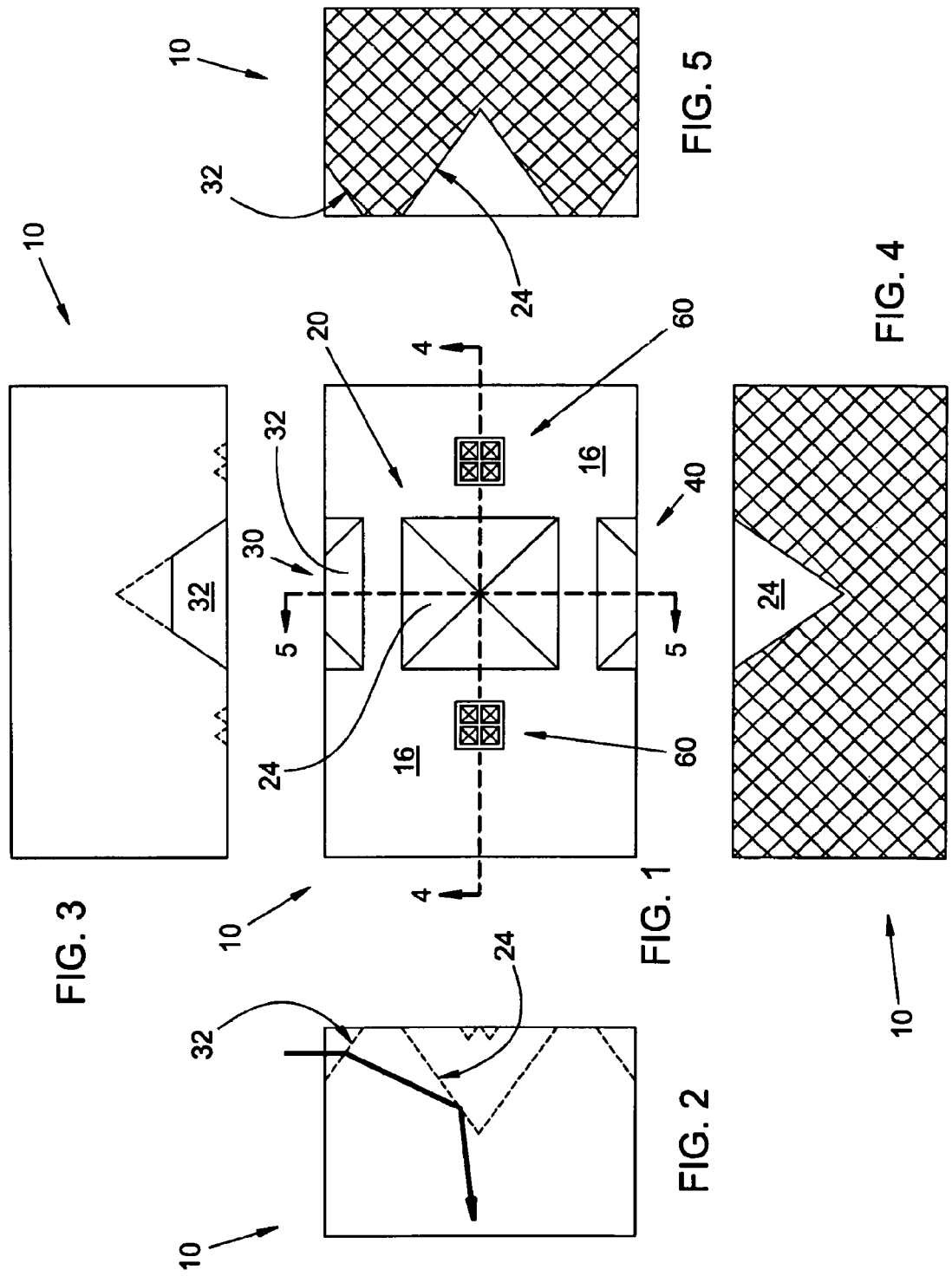

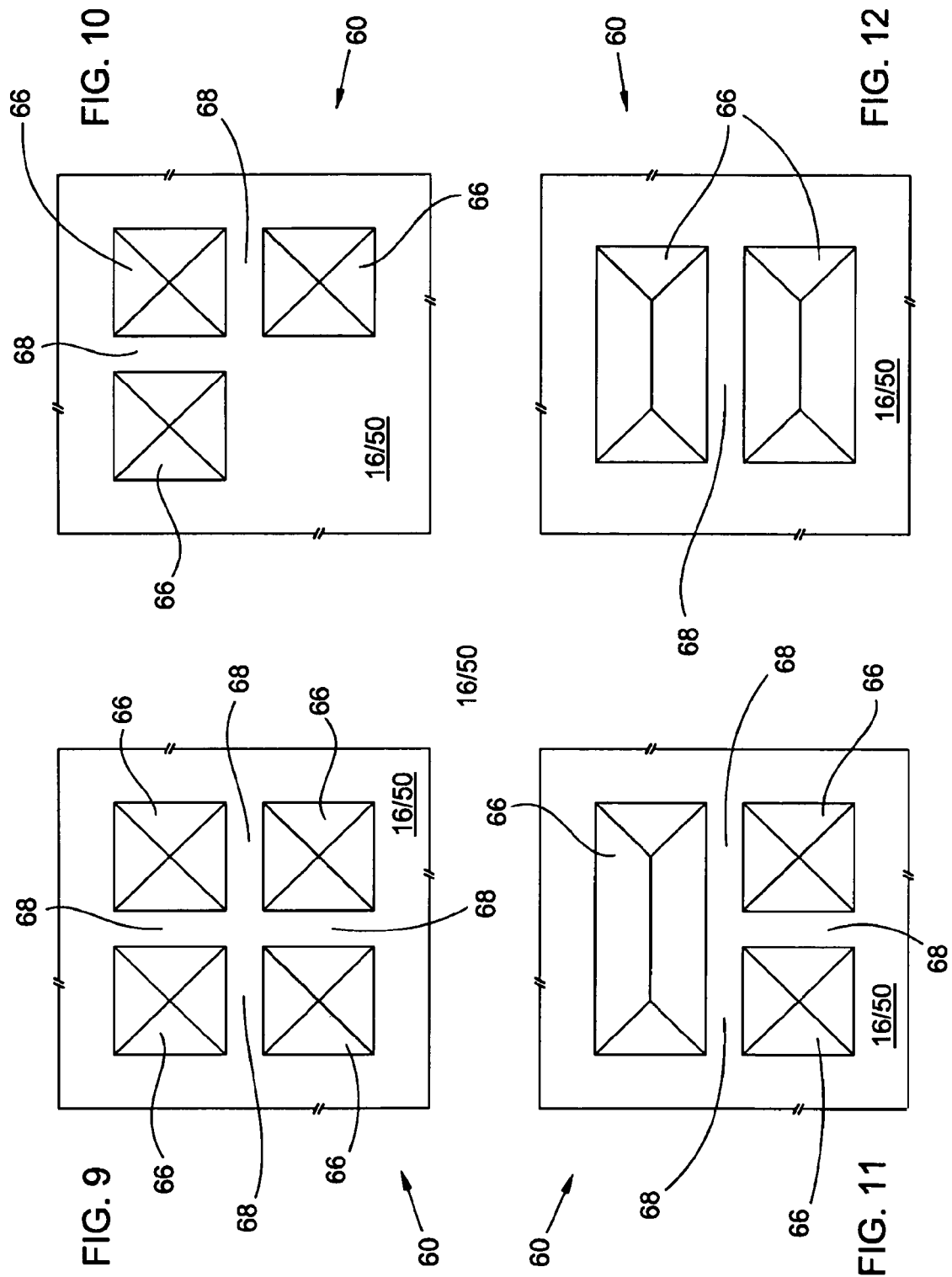

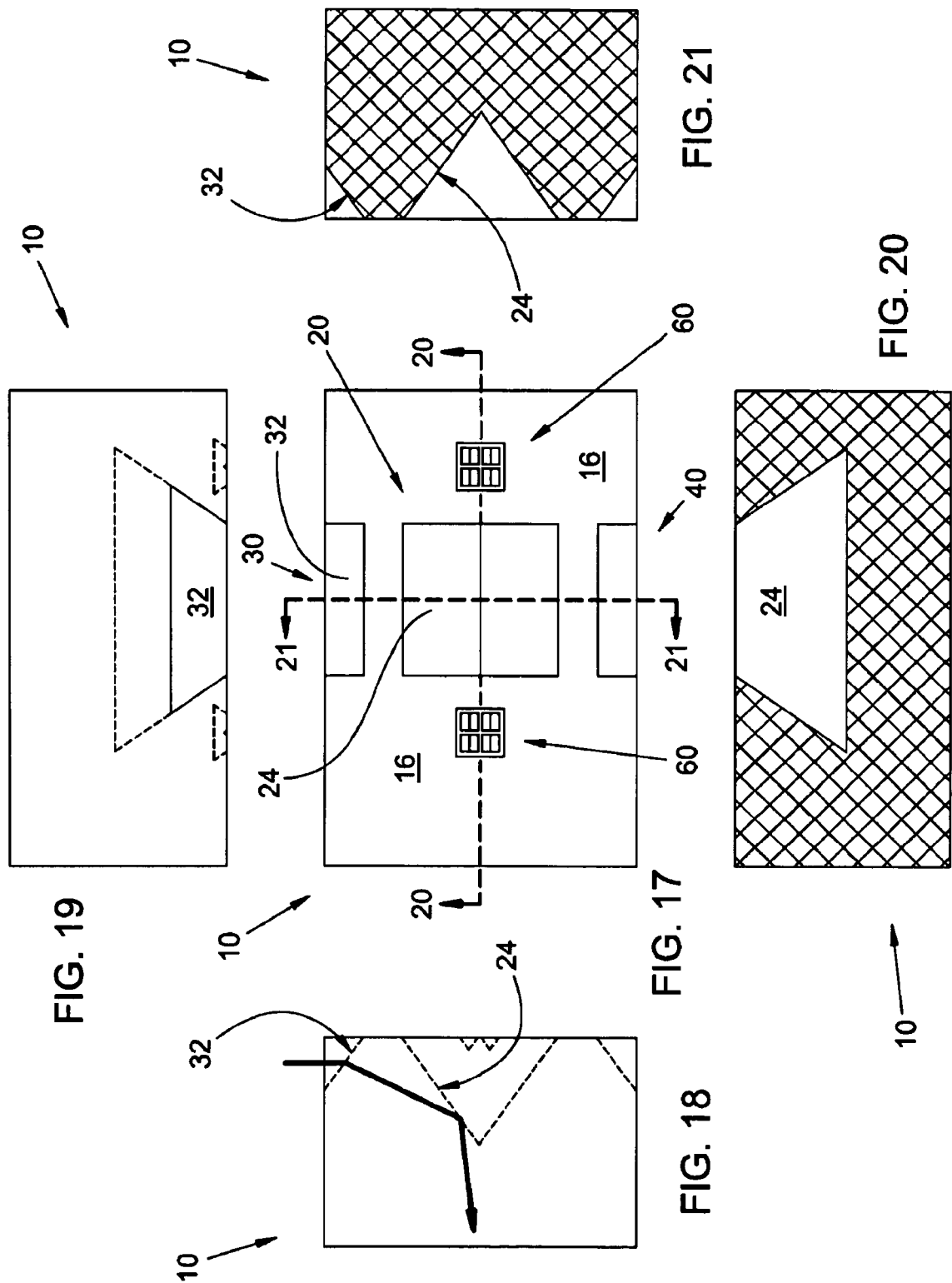

SUBMOUNT FOR OPTOELECTRONIC, OPTICAL, OR PHOTONIC COMPONENTS

BACKGROUND

The field of the present invention relates to optical submounts for optoelectronic, optical, or photonic components. In particular, submounts are disclosed herein that (i) include refractive and reflective optical surfaces that are faces of 4-faced or 3-faced depressions on the submount bottom surface or (ii) include alignment marks comprising a set of 4-faced depressions and intervening areas.

Optical submounts are employed in a variety of circumstances to indirectly attach to a substrate and to support an optoelectronic, optical, or photonic component. The submount typically is arranged to redirect light propagating substantially parallel to the surface of the substrate to the supported component (or vice versa). The optical submount can serve one or more additional purposes, including but not limited to: mechanical support, positioning or alignment, heat dissipation, or electrical connection. One example is disclosed in, e.g., U.S. Pat. No. 6,921,956 entitled "Optical apparatus using vertical light receiving element" issued Jul. 26, 2005 to Yang et al.

SUMMARY

An apparatus comprises an optical submount formed from a volume of semiconductor or dielectric material that is substantially transparent over an operational wavelength range. A bottom surface of the submount includes a first 3-faced depression at a forward edge of the bottom submount surface and a 4-faced depression. The submount is arranged to direct or transmit a portion of an optical signal to propagate within the volume of semiconductor or dielectric material between a transmission area of a rearward face of the first 3-faced depression and a transmission area of a top surface of the submount. The optical signal is at least partly internally reflected by a forward face of the 4-faced depression. The 4-faced depression is substantially circumscribed by one or more substantially flat, substantially horizontal, substantially coplanar areas of the bottom submount surface. The 4-faced depression is separated from the first 3-faced depression by one of the one or more substantially flat, substantially horizontal, substantially coplanar areas of the bottom submount surface.

Another apparatus comprises a first optical element arranged to be attached to a second optical element with an engagement surface of the first optical element on a corresponding engagement surface of the second optical element. The first optical element engagement surface includes one or more sets of 4-faced depressions; each set comprises two or more adjacent 4-faced depressions and one or more intervening substantially flat, substantially horizontal, substantially coplanar areas of the first optical element engagement surface. The intervening areas of each set form a corresponding alignment mark arranged for positioning the first optical element on the second optical element.

Objects and advantages pertaining to optical submounts or alignment marks may become apparent upon referring to the exemplary embodiments illustrated in the drawings and disclosed in the following written description or appended claims. This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIGS. 1-3 are schematic bottom, side, and front views, respectively, of an exemplary optical submount.

FIGS. 4 and 5 are schematic cross-sectional views of the exemplary optical submount of FIGS. 1-3.

FIGS. 9-12 illustrate schematically various exemplary alignment marks formed by two or more 4-faced depressions.

FIGS. 17-19 are schematic bottom, side, and front views, respectively, of another exemplary optical submount.

FIGS. 20 and 21 are schematic cross-sectional views of the exemplary optical submount of FIGS. 17-19.

Figure 6:
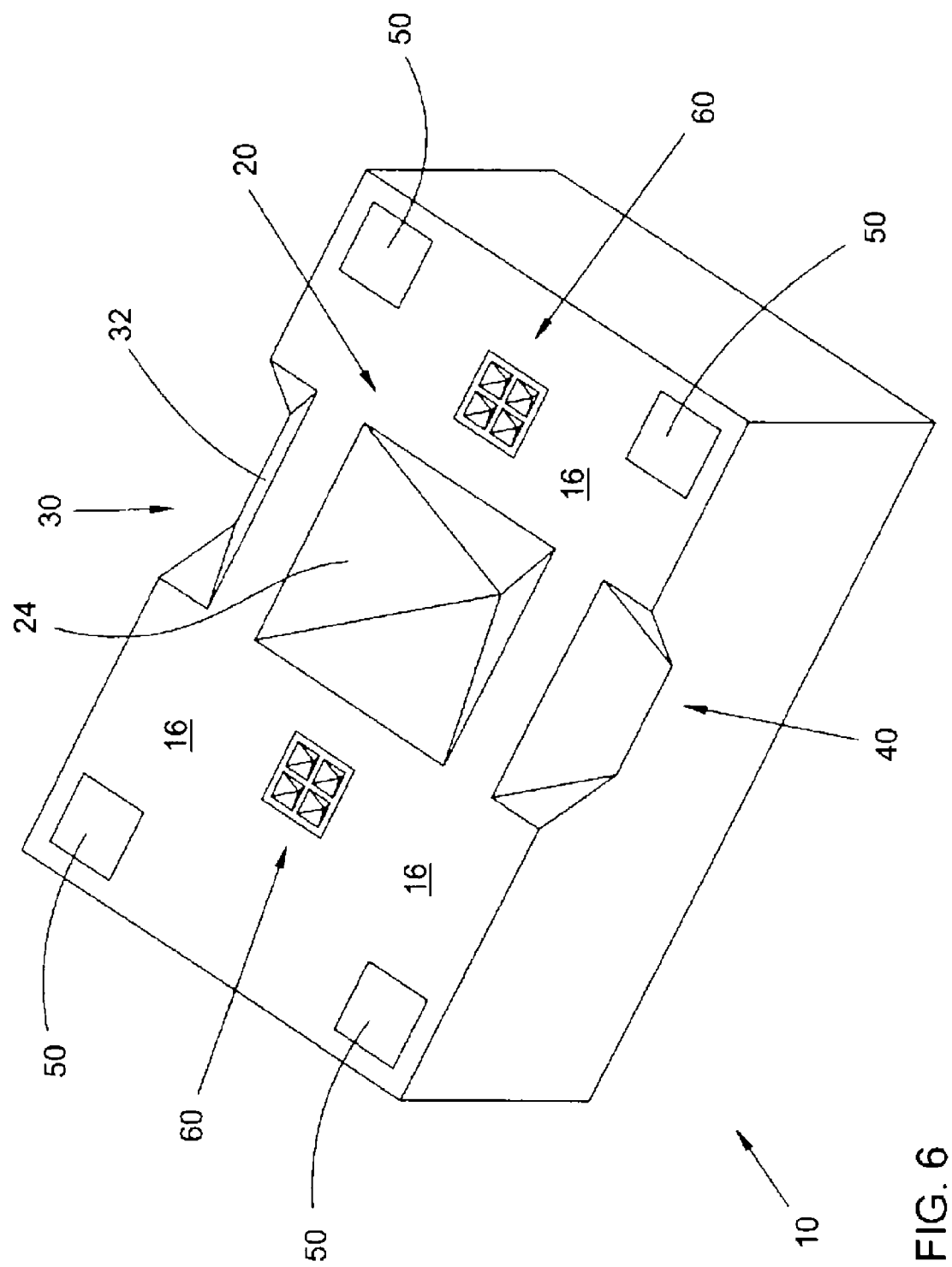
FIG. 6 is a schematic perspective view of the exemplary optical submount of FIGS. 1-5.

It should be noted that the embodiments depicted in this disclosure are shown only schematically, and that not all features may be shown in full detail or in proper proportion. Certain features or structures may be exaggerated relative to others for clarity. It should be noted further that the embodiments shown are exemplary only, and should not be construed as limiting the scope of the written description or appended claims.

DETAILED DESCRIPTION OF EMBODIMENTS

An optical submount is sometimes employed to attach a component to a substrate indirectly; the component is attached to the submount and the submount is attached to the substrate. Optical submounts are employed in a variety of circumstances to indirectly attach to a substrate an optoelectronic, optical, or photonic component and to redirect light propagating substantially parallel to the surface of the substrate to the supported component (or vice versa). The submount can serve one or more additional purposes, including but not limited to: mechanical support, positioning or alignment, heat dissipation, or electrical connection. Attachments can be made using adhesive, solder, or other suitable means. If solder is employed, metallized areas (i.e., metal contacts) are needed to allow the solder to adhere to a nonmetallic substrate, submount, or component. Such a metal contact and solder can be employed to provide only mechanical attachment, or can be employed to provide an electrical or thermal conduction path between the attached elements (e.g., component to submount or submount to substrate) in addition to providing mechanical attachment.

Generally, the optical submount can comprise a volume of any suitable solid material that is substantially transparent over a desired operational wavelength range so that the optical signal can be redirected by transmission through the submount. Suitability of a given material can be determined by any one or more of other optical properties, availability, cost, ease of processing, dimensional stability, thermal or electrical transport properties, or other relevant material property or parameter. Examples include semiconductor material (e.g., doped or undoped silicon or another doped or undoped Group IV semiconductor, a doped or undoped III-V semiconductor, or a doped or undoped II-VI semiconductor) or dielectric material (e.g., a glassy material, a crystalline material, a ceramic material, a metal oxide, nitride, or oxynitride, or a semiconductor oxide, nitride, or oxynitride). The choice of material typically is at least partly determined by functionality to be provided by the submount. Semiconductor material can be employed for an operational wavelength range that extends, e.g., from about 1.2 μm to about 1.7 μm. Dielectric material can be employed for an operational wavelength range that extends, e.g., from about 0.4 μm to about 2 μm. Other materials or other operational wavelength ranges can be employed.

For purposes of the present disclosure or appended claims, the term "4-faced depression" shall denote a depression that has a 4-sided opening on a surface of a material and has four substantially flat lateral faces extending into the bulk of the material. The 4-sided opening typically, but not necessarily, is square or rectangular. Each lateral face of a 4-faced depression is a triangle or a quadrilateral; quadrilaterals include trapezoids, parallelograms, rhombi, rectangles, or squares. Examples of 4-faced depressions can include depressions that (i) are truncated to terminate at a flat end (with four trapezoidal lateral faces and a square or rectangular opening; each trapezoidal face can form an acute, right, or obtuse angle with the surface), (ii) form a v-groove (with two trapezoidal lateral faces, two triangular lateral faces, and a square or rectangular opening; each trapezoidal lateral face forms an obtuse angle with the surface and each triangular lateral face can form an acute, right, or obtuse angle with the surface), or (iii) terminate at a point (i.e., a full-pyramidal depression, with four triangular lateral faces and a substantially square opening and with each triangular lateral face forming an obtuse angle with the surface).

For purposes of the present disclosure or appended claims, the term "3-faced depression" shall denote a depression that is truncated laterally by an edge of the surface on which it is located, so that its opening has only three sides and the depression includes only three substantially flat lateral faces. The fourth side of the opening and the fourth lateral face are missing (thereby forming a lateral extension of the opening), but a 3-faced depression is otherwise similar to a 4-faced depression as described above. Each lateral face of a 3-faced depression is a triangle or a quadrilateral. Examples of 3-faced depressions can include those examples of 4-faced depressions described above, except for the missing fourth side of the opening and missing fourth lateral face.

In a first specific example, 4-faced and 3-faced depressions can be formed by masked, anisotropic wet etching of the (100) surface of a single-crystal silicon wafer. A square or rectangular opening can be formed in an etch mask and aligned with lines of intersection of the (100) and several of the {111} surfaces (each of which forms a dihedral angle of 54.7° with respect to the (100) surface). Hot, aqueous KOH can be employed as the etchant, selectively etching the (100) surface at a rate that is about 100 to 200 times the etch rate of the {111} surfaces; other suitable directionally selective etchants can be employed. The resulting tapered depression has triangular or trapezoidal lateral faces that each form an obtuse angle of 125.3° (i.e., 180° minus 54.7°) with the (100) surface and substantially coincide with a corresponding one of the (111) crystal planes. The etch can be taken "to completion" to form a pyramidal depression (if the mask opening is square; e.g., as in FIGS. 1-5) or a v-groove (if the mask opening is rectangular). Shorter etch times yield a flat-bottomed depression, i.e., a truncated pyramid or v-groove.

In a second specific example, 4-faced and 3-faced depressions can be formed by masked, anisotropic wet etching of the (100) surface of single-crystal indium phosphide wafer. A square or rectangular opening can be formed in an etch mask and aligned with lines of intersection of (100) and several of the {111}A and {111}B surfaces (each of which forms a dihedral angle of 54.7° with respect to the (100) surface). A suitable directionally selective etchant can be employed to form a depression having triangular or trapezoidal lateral faces. Different ones of the {111} surfaces of indium phosphide etch at different rates, with the {111}B surfaces etching at a higher rate than the {111}A surfaces. Two of the lateral faces form obtuse angles of 125.3° with the (100) surface and substantially coincide with corresponding ones of the {111}A crystal planes. The angles of the other two lateral faces vary depending on the etch time, ranging from obtuse angles of 125.3° with respect to the (100) surface early in the etch (substantially coinciding with a corresponding one of the {111}B surfaces) to acute angles of 54.7° with respect to the (100) surface if the etch is taken "to completion" (substantially coinciding with corresponding ones of the {111}A surfaces; e.g., as in FIGS. 17-21).

In other examples, directional (i.e., anisotropic) dry etching (e.g., plasma etching or reactive ion etching) can be employed to form 4-faced or 3-faced depressions (i) in a single-crystal material wherein the lateral faces do not necessarily coincide with crystal planes, or (ii) in material that is not a single crystal, e.g., in amorphous, polycrystalline, or heterogeneous material. Any suitable spatially selective material processing technique (e.g., lithography, etching, masking, deposition, lift-off, etc.) can be employed to form 4-faced or 3-faced depressions within the scope of the present disclosure or appended claims.

An exemplary optical submount 10 is illustrated schematically in FIGS. 1-6. The optical submount 10 is formed from a volume of semiconductor or dielectric material that is substantially transparent over an operational wavelength range. The bottom surface 16 of the submount 10 includes a first 3-faced depression 30 (at a forward edge of the bottom submount surface 16), a second 3-faced depression 40 (at a rearward edge of the bottom submount surface 16), and a 4-faced depression 20 between the first and second 3-faced depressions 30 and 40. "Bottom" refers to the surface of the submount 10 intended to rest against a "top" surface of a substrate to which it is attached; "top" refers to the surface of the submount 10 opposite the bottom surface, to which a component is typically attached. Neither "top" nor "bottom" are intended to indicate absolute spatial directions. The submount is arranged to direct or transmit a portion of an optical signal to propagate within the volume of material between (i) a transmission area of a rearward face 32 of the first 3-faced depression 30 and (ii) a transmission area of a top surface of the submount, with the optical signal being at least partly internally reflected (partial or total internal reflection) by a forward face 24 of the 4-faced depression 20 (as in FIGS. 2 and 14). "Forward" denotes the direction from which an optical signal propagating substantially parallel to a substrate surface approaches an optical submount 10 attached to the substrate; "rearward" denotes the opposite direction. Neither "forward" nor "rearward" are intended to indicate absolute spatial directions. The optical signal typically is refracted upon transmission through the rearward face 32 of the first 3-faced depression 30. In the examples shown, the 4-faced depression 20 has four triangular lateral faces and the 3-faced depressions 30 and 40 each have one trapezoidal lateral face and two triangular lateral faces. However, the 4-faced and 3-faced depressions can assume any of the forms described above while remaining within the scope of the present disclosure or claims.

The 4-faced depression 20 is substantially circumscribed by one or more substantially flat, substantially horizontal, substantially coplanar areas of the bottom submount surface 16. The 4-faced depression 20 is separated from the first and second 3-faced depressions 30 and 40 by one or more of the substantially flat, substantially horizontal, substantially coplanar areas of the bottom submount surface 16. In the examples shown, a single, contiguous area of the bottom submount surface 16 surrounds the 4-faced depression 20. However, gaps in that circumscription can exist while nevertheless "substantially circumscribing" the 4-faced depression 20. To differentiate from a 3-faced depression, at least a portion of each of the four sides of the opening of the 4-faced depression should be bounded by the submount bottom surface 16 for the depression to be considered "substantially circumscribed"; otherwise, if one or more sides were not so bounded, the depression would be only 3-faced.

Figure 15:
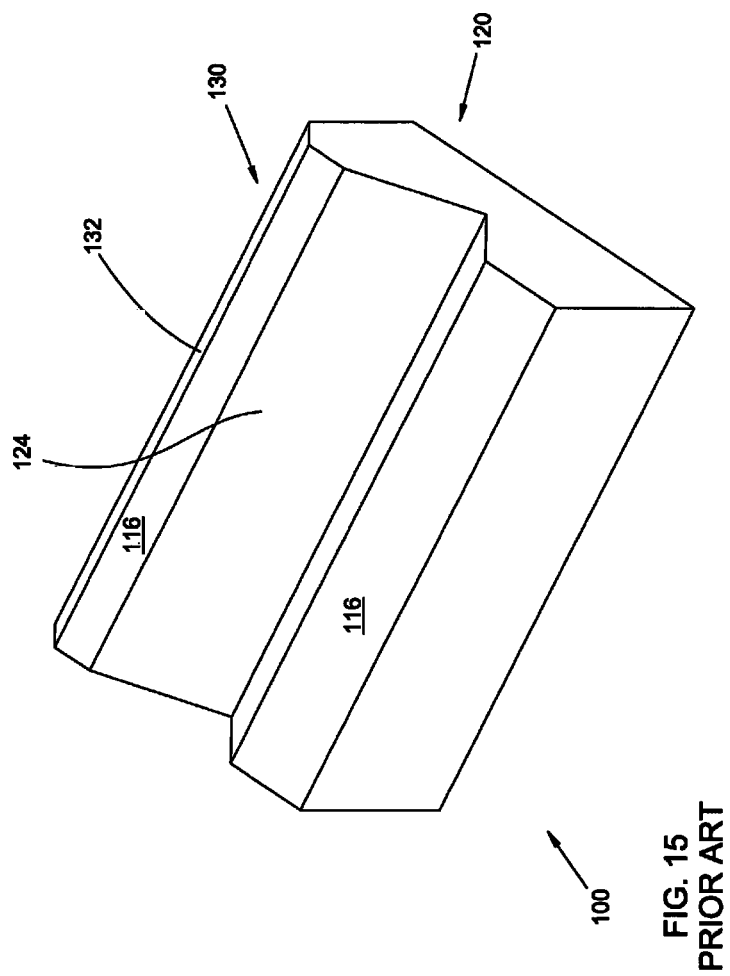
FIG. 15 is a schematic perspective view of a conventional optical submount.
Figure 16A:
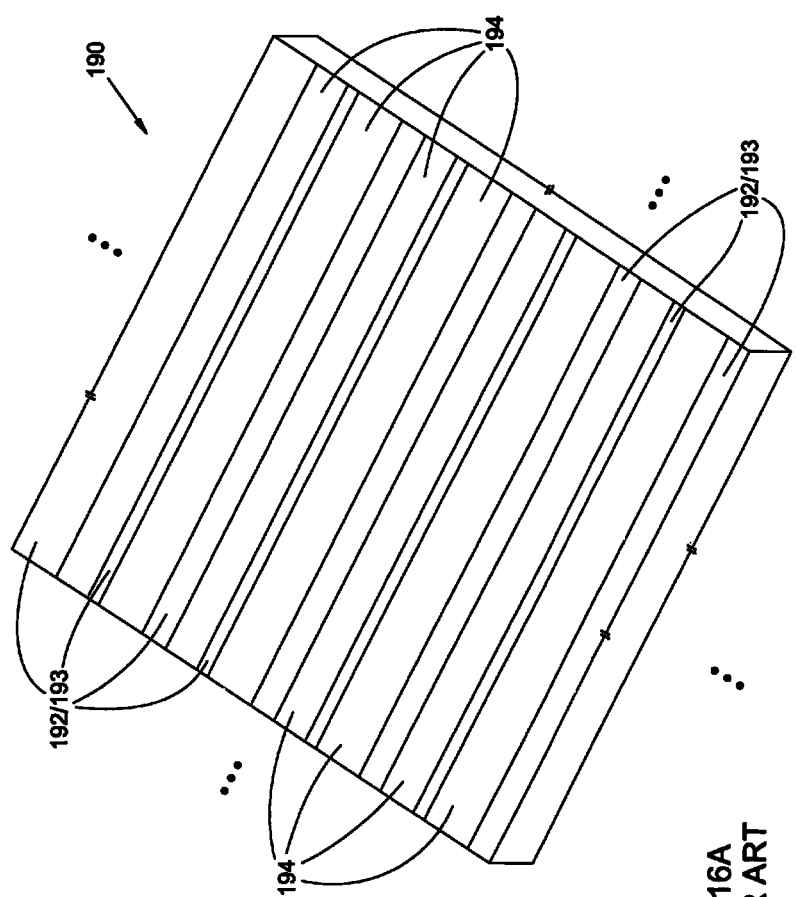
FIGS. 16A-16C illustrate schematically a conventional fabrication sequence for making a multitude of the conventional optical submounts of FIG. 15.
Figure 16B:
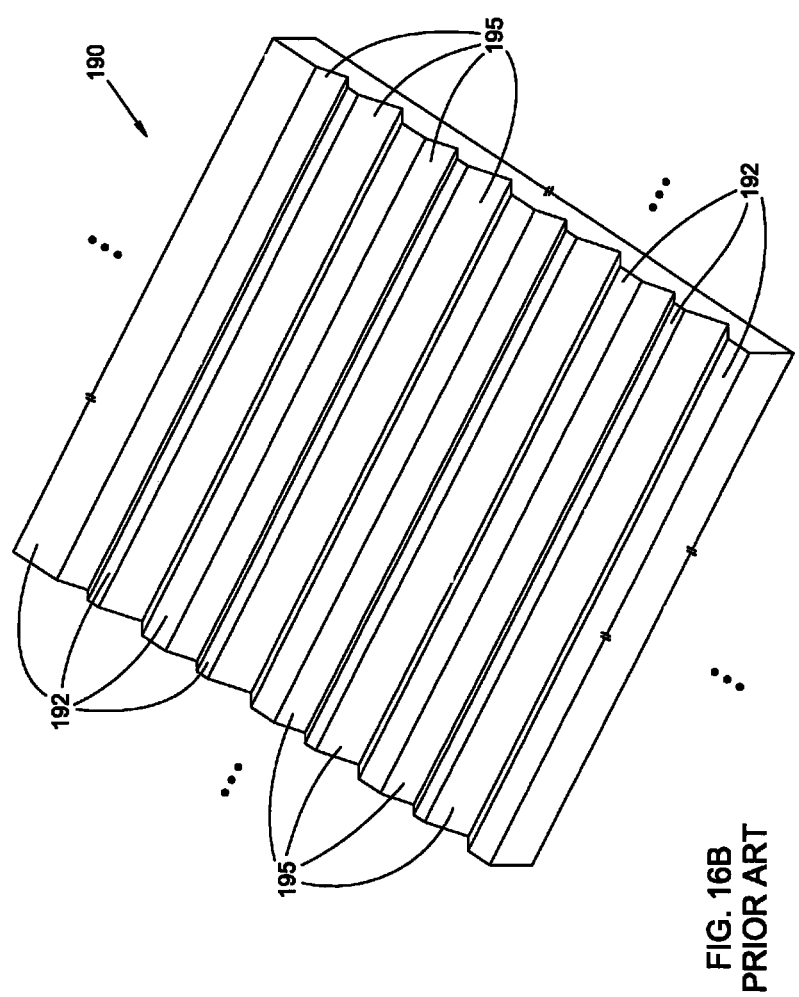
Figure 16C:
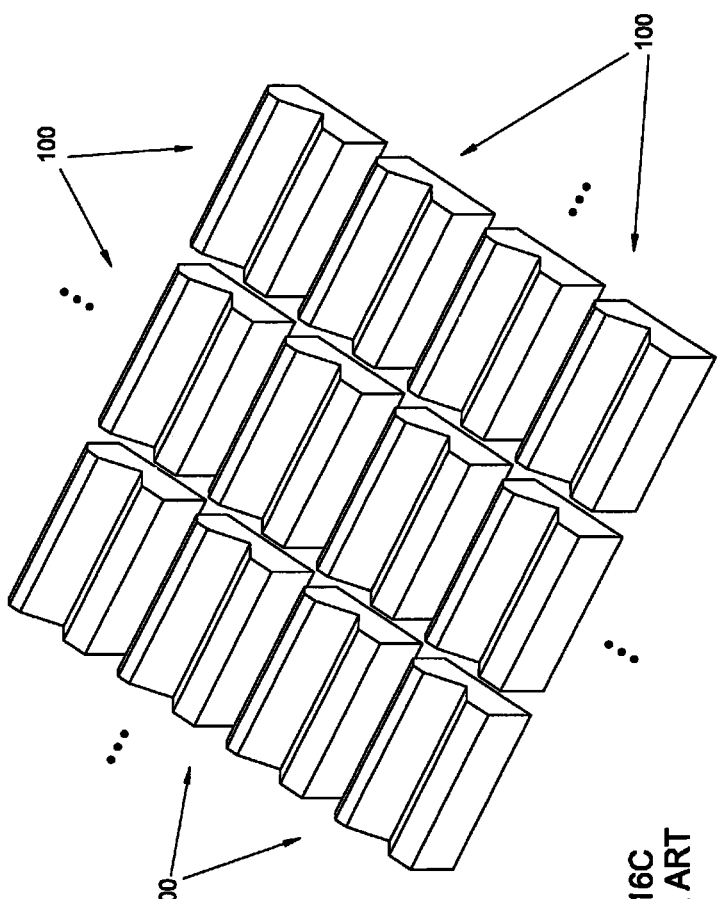
Figure 22:
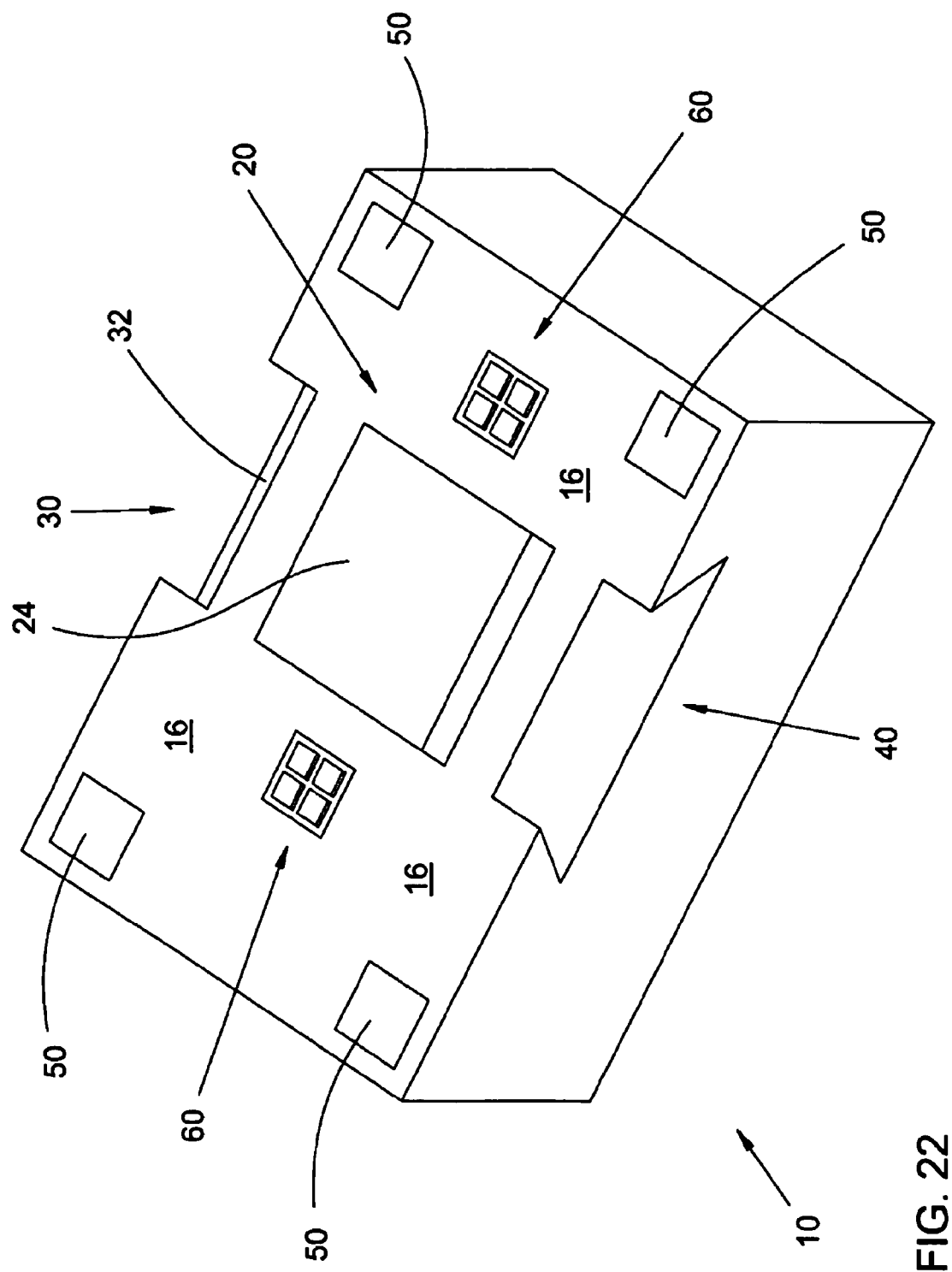
FIG. 22 is a schematic perspective view of the exemplary optical submount of FIGS. 17-21.

The circumscription of the 4-faced depression 20 by the substrate bottom surface 16 affects the overall mechanical strength of the optical submount 10, both during its fabrication and during its bonding to a substrate. The optical arrangement of the submount 10 is similar to that of conventional optical submounts, e.g., the optical submount disclosed in U.S. Pat. No. 6,921,956 noted above (hereinafter the '956 patent). However, the '956 patent discloses only grooves 120 and 130 that form refracting surface 132 and reflecting surface 124 (as in FIG. 15). The groove 120 in particular, due to its extension across the entire width of the submount 100, can significantly weaken the submount structurally. That structural weakness can manifest itself as a fracture along the groove 120, during bonding of the submount 100 to a substrate or later due to thermal cycling of the submount 100 and the substrate to which it is attached. An exemplary conventional fabrication process of many conventional submounts 100 from a wafer 190 is illustrated schematically in FIGS. 16A-16C. A mask layer 193 is deposited on the wafer surface 192 and patterned to leave the wafer surface exposed in elongated areas 194 (FIG. 16A). Etching (typically anisotropic wet etching of a crystalline material) creates grooves 120 and 130 that extend across the width of the wafer 190 (FIG. 16B) and weaken it structurally, perhaps leading to breakage during subsequent steps (e.g., division of the wafer 190 into single rows of submounts 100, or division of a single row into individual submounts 100, as in FIG. 16C; that latter breakage could occur even if the grooves 120/130 did not extend across the entire wafer 190).

Figure 8A:
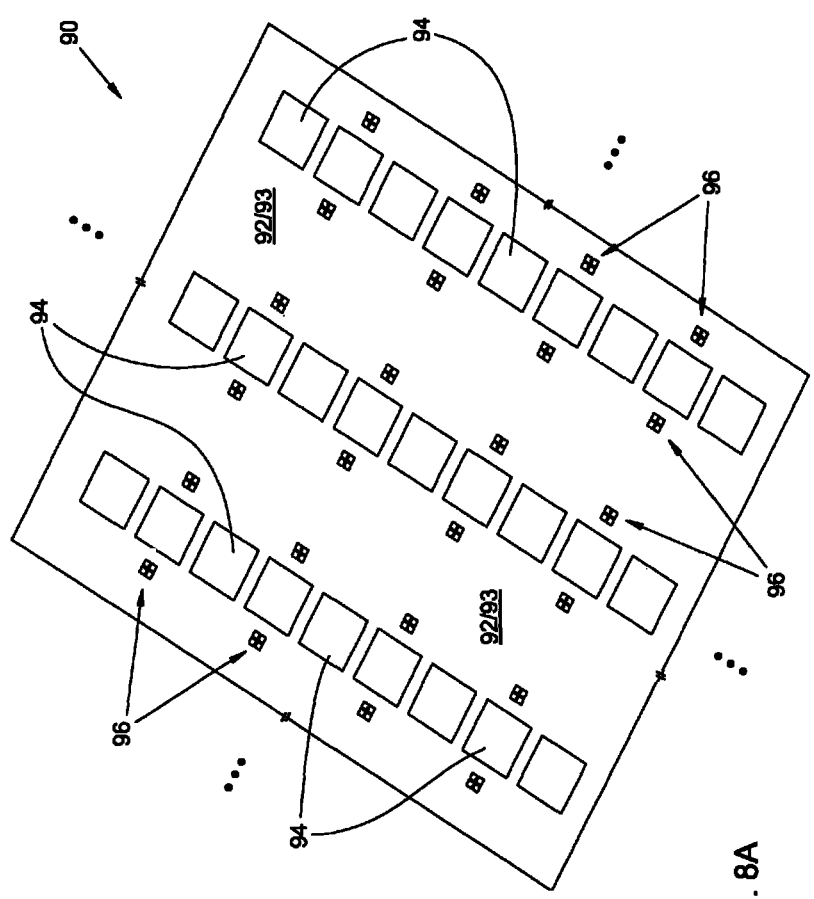
FIGS. 8A-8C illustrate schematically an exemplary fabrication sequence for making a multitude of the optical submounts of FIGS. 1-7.
Figure 8B:
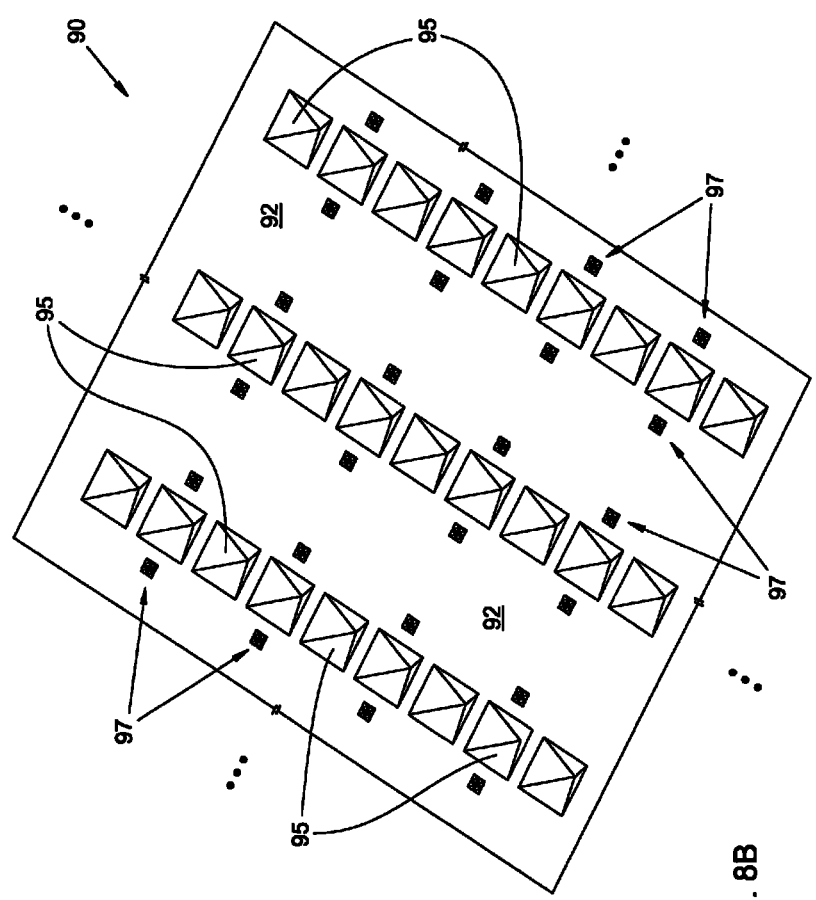

By employing 4-faced and 3-faced depressions 20, 30, and 40, the structural weaknesses described above can be avoided in the optical submount 10. The presence of one or more areas of submount bottom surface 16 that circumscribe the 4-faced depression 20 ensures that the overall structural strength of the submount 10 is not significantly compromised. The optical submount 10 can therefore more robustly tolerate mechanical stresses to which it is subjected during, e.g., bonding to a substrate or subsequent thermal cycling. Similarly, the absence of etched grooves on the wafer 90 reduces the likelihood of wafer breakage during fabrication of submounts 10. An exemplary fabrication process is illustrated schematically in FIGS. 8A-8C. A mask layer 93 is deposited on the wafer surface 92 and patterned to leave the wafer surface exposed in square or rectangular areas 94 (FIG. 8A). Etching (typically anisotropic wet etching of a crystalline material) creates 4-faced depressions 95 (FIG. 8B). Because those 4-faced depressions 95 a substantially circumscribed by the wafer 92, there is little or no significant structural weakening of the wafer 90 or of single rows of submounts 10.

Figure 8C:
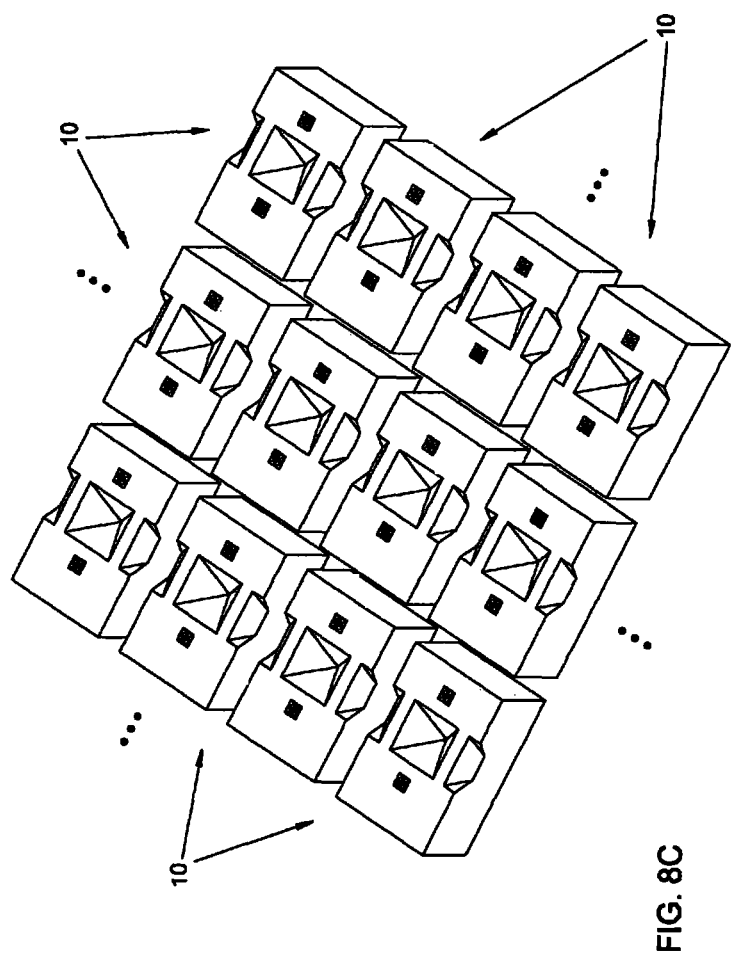

The 4-faced depressions 95 can be arranged in multiple substantially parallel rows. After the 4-faced depressions 95 are formed, the wafer 90 is divided (i.e., diced) to form individual optical submounts 10 (FIG. 8C). The wafer 90 is diced along cut lines (i.e., along die streets) using any suitable technique, e.g., by scribing and breaking, by mechanical sawing, or by laser cutting. The cut lines are arranged to avoid certain rows of the array of 4-faced depressions 95 so that at least one 4-faced depression 20 of the array remains on each one of the multitude of individual submounts 10 formed by dicing the wafer 90. The cut lines are also arranged so as to intersect certain rows of the array of 4-faced depressions 95 so as to leave the 3-faced depressions 30 and 40 at the forward and rearward edges, respectively, of each one of the multitude of individual submounts 10 formed by dicing the wafer 90.

The presence of the second 3-faced depression 40 is not required for the optical function of the submount 10. An exemplary optical submount 10 that lacks a second 3-faced depression 40 is illustrated schematically in FIG. 13. It can be advantageous to fabricate the submounts 10 that include the second 3-faced depression 40 to enable a higher density of submounts 10 to be formed on the wafer 90. One 4-faced depression 95 on the undivided wafer 90 can be split by a cut line to form the 3-faced depression 30 at the forward edge of one submount 10 and the 3-faced depression 40 on the rearward edge of an adjacent submount 10.

Figure 7:
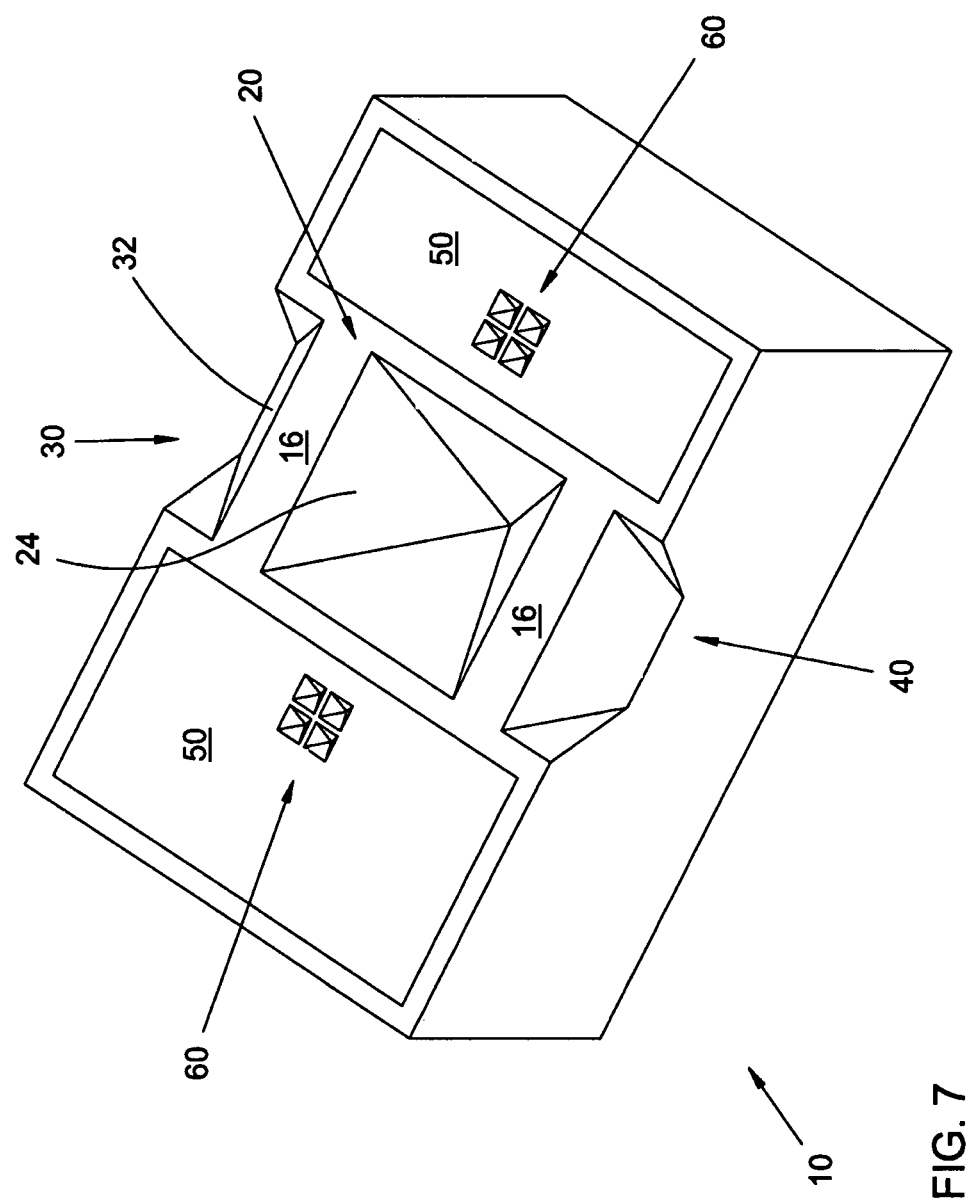
FIG. 7 is a schematic perspective view of another exemplary optical submount.
Figure 13:
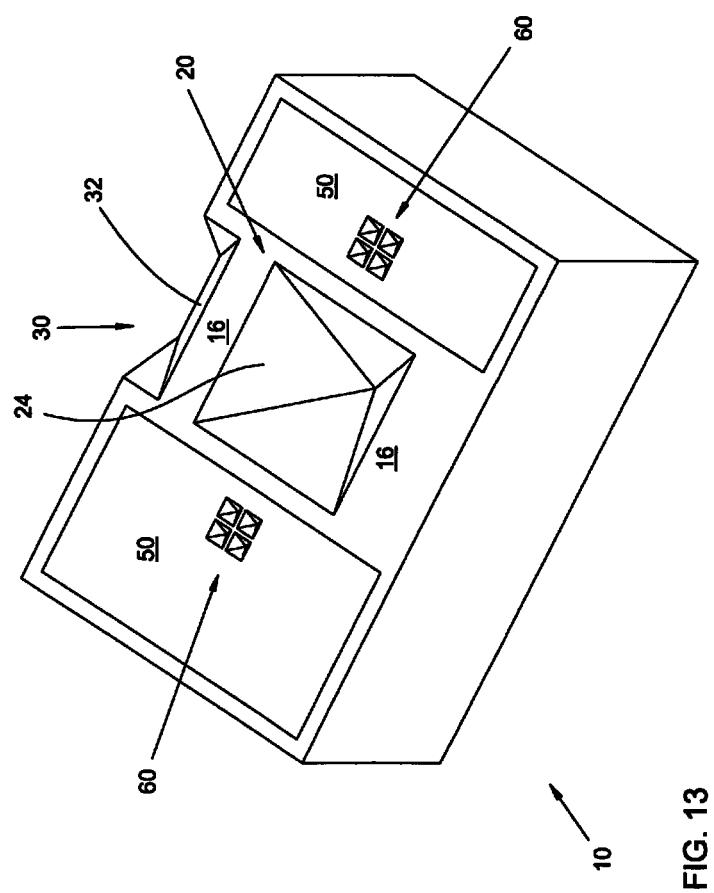
FIG. 13 is a schematic perspective view of another exemplary optical submount.

The bottom submount surface 16 can include one or more areas that include a metal coating 50 to facilitate attachment of the submount to a substrate, e.g., by soldering. Any suitable number or arrangement of such metal-coated areas 50 can be employed. One arrangement of four such areas is illustrated in FIG. 6; a different arrangement of two such areas is illustrated in FIGS. 7 and 13.

Metal-coated areas 50 are omitted from FIGS. 1-5 and 8A-8C so as not to overly clutter those drawings. The metal-coated areas can comprise any suitable one or more metals or alloys deposited using any suitable technique. Often such areas are formed simultaneously on a multitude of submounts 10 during the fabrication sequence of FIGS. 8A-8C before division of the wafer 90 into the individual submounts 10.

In many instances, one or more (or all) of the faces of the 4-faced and 3-faced depressions 20, 30, or 40 or the bottom substrate surface 16 substantially coincide with corresponding crystal planes of a crystalline material that makes up the volume of the optical submount 10. Anisotropic wet etching typically results in such crystallographic surfaces when employed to form the 4-faced and 3-faced depressions 20, 30, and 40 (typically by forming 4-faced depression 95 on the wafer 90). The bottom submount surface 16 often substantially coincides with a corresponding crystal plane that is substantially parallel to the surface of wafer 90. However, any suitable method can be employed for forming the 4-faced and 3-faced depressions, including methods that do not necessarily include anisotropic wet etching, that do not necessarily include masking, that do not necessarily require crystalline material, or that are not necessarily implemented on a wafer scale to simultaneously produce a multitude of submounts. For example, directional dry etching of amorphous or polycrystalline material or so-called grayscale lithography can be employed to form optical submounts 10. In another example, it may be desirable in certain instances to fabricate individual submounts 10 separately, as discrete units not connected to one another during fabrication. Such alternative methods for fabricating the submount 10 shall fall within the scope of the present disclosure or appended claims.

Figure 14:
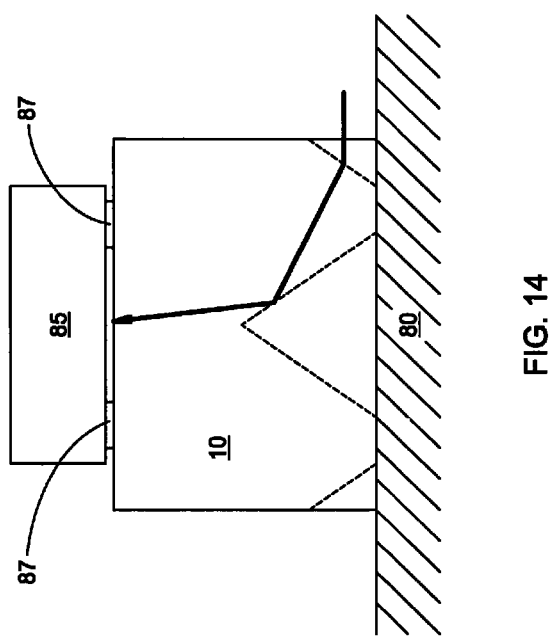
FIG. 14 illustrates schematically an optical path through an exemplary optical submount with a photodetector mounted thereon.

One example of use of the optical submount 10 is illustrated schematically in FIG. 14. The optical submount 10 can be attached to a substrate 80 in any suitable way (e.g., by soldering of metal-coated areas 50 on the submount bottom surface 16). The top surface of the submount 10 can be adapted in any suitable way for transmitting an optical signal. For example, the top submount surface can include an anti-reflection coating of any suitable type (including examples disclosed below). The top submount surface can also include metal contact areas 87 of any suitable type, material, number, and arrangement to attach a photodetector 85 (e.g., a p-i-n or avalanche photodiode or other photodetector) to the top submount surface in a position to receive the optical signal transmitted therethrough. As shown in the example of FIG. 14, an optical signal propagating substantially parallel to the surface of substrate 80 (e.g., having emerged from the end of an optical waveguide on the substrate 80) can (i) enter the optical submount 10 through the rearward face 32 of the 3-faced depression 30, (ii) be refracted upon transmission through the face 32, (iii) propagate within the submount 10 to the forward face 24 of the 4-faced depression 20, (iv) be internally reflected by the face 24, (v) propagate within the submount 10 to the transmission area of the top surface of submount 10, (vi) be transmitted through the top submount surface, and (vii) impinge on the photodetector 85.

In another use example (not shown), a light source can be mounted on the top surface of submount 10 and arranged to launch an optical signal vertically downward toward a transmission area of the top submount surface. That launched optical signal can (i) enter the optical submount 10 through the transmission area the top submount surface (ii) propagate within the submount 10 to the forward face 24 of the 4-faced depression 20, (iii) be internally reflected by the face 24, (iv) propagate within the submount 10 to the rearward face 32 of the 3-faced depression 30, (v) be refracted upon transmission through face 32, (vi) propagate outside the submount 10. If it is desirable for the optical signal to propagate substantially parallel to a substrate upon exiting the submount 10, the orientations of the faces 24 or 32 can be arranged accordingly. The preceding examples are only two among myriad configurations or arrangements in which the optical submount 10 can be employed to support an optoelectronic, photonic, optical, or other component (e.g., a photodetector or a light source) and route an optical signal to or from that component, any of which can fall within the scope of the present disclosure or appended claims.

In addition to providing a point of mechanical attachment for the photodetector 85 (or other component), at least one of the metal contacts 87 (if present) can also be employed in some embodiments to provide an electrical conduction path between the component and the submount 10. If used for an electrical connection, one or more of the metal contacts 87 can include a wire-bonding area to facilitate an electrical connection to the component via the metal contact 87, if needed or desired. One or more of the metal contacts 87 can also be employed to provide a thermal conduction path between the component and the optical submount 10, if needed or desired.

An anti-reflection layer (if present on the transmission area of the top submount surface) can comprise any suitable dielectric material that is compatible with the semiconductor or dielectric material of the optical submount 10. Examples include metal oxides, nitrides, or oxynitrides or semiconductor oxides, nitrides, or oxynitrides. One specific example comprises an anti-reflection layer comprising silicon nitride on a semiconductor submount comprising silicon (doped or undoped). The anti-reflection layer can comprise a single quarter-wave ($\lambda/4$) layer at a selected wavelength within the operational wavelength range. For silicon nitride and an operation wavelength range of about 1.2-1.7 µm, the resulting thickness typically is between about 100 nm and about 300 nm, for example. Other materials or thicknesses can be employed, or the anti-reflection layer can be arranged for use over a different operational wavelength range. Other anti-reflection layer arrangements can be employed, e.g., a multilayer antireflection coating.

It is often desirable to employ standard chip or die bonders to position and attach an optoelectronic, photonic, or optical component to a substrate, either directly or by attaching a submount to the substrate and attaching the component to the submount. Such bonders often employ a vacuum chuck or other device to grasp the component or submount, move it to and position it on the substrate, and hold it there while it is attached to the substrate. A visualization system, e.g., a machine vision system, is often employed to guide the proper positioning of the component or submount relative to the substrate. Alignment marks or registration marks are often formed on the component or submount,. and corresponding marks are formed on the substrate, to provide a reference point for the visualization system. For example, alignment marks on the submount and on the substrate can be arranged so that they appear to overlap one another only when the submount is at the desired position on the substrate. The formation of such marks can be problematic. The marks must be positioned on the component, submount, or substrate with sufficient accuracy to enable sufficient accuracy of relative positioning of those marked objects. The edges of the marks must be sufficiently well defined and precisely located so as to enable sufficient precision of relative positioning of the marked objects. The marks must be sufficiently visible to enable detection and positioning by the visualization system.

Metal-coated areas or features are good candidates for forming alignment marks. The opacity and reflectivity of many metal coatings or films (e.g., gold) typically enable the alignment marks to be readily visualized by a machine vision system or a human operator. Conventional lithographic techniques (e.g., deposition followed by masked etching, masked deposition followed by lift-off, photolithography, or other spatially selective material processing techniques) can be employed to accurately position metal-film alignment marks on a component, submount, or substrate. However, it has been observed that the small feature size (e.g., a line of metal film only a few micron across) or clean edges can be problematic to achieve, because removal of the mask, patterning of the metal, or subsequent processing steps often also inadvertently remove portions of the metal film alignment-marks. In addition, many conventional patterning techniques are problematic when used near significant vertical topography (e.g., depressions 20, 30, or 40), which can degrade the accuracy or precision of the positioning of a metal-film alignment mark. Further, forming the alignment marks by processing steps separate from those used to form depressions 20, 30, and 40 requires care to provide accurate positioning of the marks relative to the depressions.

Various of the exemplary embodiments shown in the drawings illustrate an alternative arrangement for providing an alignment mark that mitigates or avoids the problems noted above. The bottom surface of a submount 10 (or the bottom surface of an optoelectronic, photonic, or optical component, or the top surface of a substrate; generically, "optical element" can encompass all three possibilities: substrate, submount, or component) can include one or more sets 60 of 4-faced depressions (as seen in FIGS. 1, 6, 7, 9-13, 17, and 22). Each set 60 can comprise two or more adjacent 4-faced depressions 66 and one or more intervening substantially flat, substantially horizontal, substantially coplanar areas 68 of the bottom submount surface 16. The intervening areas 68 of each set 60 form a corresponding alignment mark arranged for positioning the optical submount 10 on a substrate. Concurrent formation of the depressions 66 and the depressions 20, 30, and 40 ensures sufficiently accurate and precise relative positioning of those structural features. The differing orientations of the faces of the depressions 66 and the intervening areas 68 typically provide sufficient visual contrast between those areas for a machine vision system or human viewer. Edges between the faces of the depressions 66 and the intervening areas 68 are not typically degraded by removal of any etch mask that was employed, because the bulk material of the submount 10 typically is more robust than a thin metal coating.

The resulting alignment mark can be arranged in any desired configuration. Typically an elongated, substantially linear feature is employed to establish relative translational positioning in a direction substantially perpendicular to that linear feature. The precision of the relative positioning is determined by the width of the linear feature and the visual resolution of the visualization system. Translational positioning along a single axis requires the alignment mark to include only a single linear alignment feature. The example of FIG. 12 illustrates a set 60 of two 4-faced depressions 66 and one intervening area 68 that provides a single linear alignment feature. Two-dimensional translational positioning typically requires an alignment mark that includes two non-parallel linear features, such as a cross-("+"), T-, or L-shaped alignment mark. The example of FIG. 9 illustrates a set 60 of four 4-faced depressions 66 (in a substantially rectangular arrangement) and four intervening areas 68 that form a corresponding cross-shaped alignment mark. The examples of FIGS. 10 and 11 illustrate sets 60 of three 4-faced depressions 66 and two intervening areas 68 that form a corresponding L-shaped (FIG. 10) or T-shaped (FIG. 11) alignment mark.

To establish angular position, typically two or more alignment marks are needed. Two spatially distinct alignment marks are shown in the various examples in the drawings. A single cross-, L-, or T-shaped alignment mark can provide angular positioning if it is sufficiently large (as determined by the resolution of the visualization system and the accuracy and precision required for the angular positioning).

As with 4-faced and 3-faced depression 20, 30, and 40, the faces of the 4-faced depressions 66 can substantially coincide with corresponding crystal planes of a crystalline material semiconductor or dielectric material that forms the submount 10, or the depressions can be formed in any other suitable way that yields the desired shapes or positions, including those described above. As discussed above, any suitable fabrication method can be employed for forming the sets 60 of depressions 66 and areas 68, including those implemented on a wafer scale or on individual submounts 10.

Each set 60 of 4-faced depressions 66 and intervening areas 68 can, if desired, also include a metal film or coating 50. The metal film 50 can be deposited over the entire set 60 of 4-faced depressions 66 and intervening areas 68; there is no need to try to selectively deposit the metal film on only the areas 68. The problem of inadvertent removal of portions of the metal film is therefore eliminated. The differing orientations of the intervening areas 68 and the faces of the 4-faced depressions 66 provide sufficient visual contrast between those regions even when both are coated with metal.

As noted above, the 4-faced depressions 66 can be formed simultaneously with the 4-faced and 3-faced depressions 20, 30 or 40 on the bottom surface of the submount 10, or simultaneously with other etched features on a substrate or on another component, potentially reducing the overall number of processing steps required or ensuring sufficiently accurate and precise relative placement of the depressions 66 and the depressions 20, 30, or 40. For example, FIGS. 8A-8C show areas 96 of wafer surface 92 left unmasked (FIG. 8A) to form 4-faced depressions 97 upon etching (FIG. 8B); the 4-faced depressions 97 correspond to the 4-faced depressions 66 on the bottom surface of the submounts 10 after they are divided from the wafer 90 (FIGS. 1, 6, 7, 8C, 13, 17, and 22). The metal coating 50 typically is deposited over the depressions 66 and areas 68 before dicing the wafer 90. A single metal film 50 can be deposited on the sets 60 of the 4-faced depressions 66 and intervening areas 68 and also to form contacts or attachment areas on the submount bottom surface 16 (as in FIGS. 6, 7, 13, and 22). The metal film on the alignment marks can be spatially separate from the metal film on the attachment areas (as in FIGS. 6 and 22) or those areas can be contiguous (as in FIGS. 7 and 13).

In one specific example, a silicon submount 10 can be fabricated that is about 300-400 μm long (along the direction of incoming light in FIG. 13), about 600-800 μm wide, and about 300-400 μm high. The submount is fabricated from a single-crystal wafer 90 having a surface 92 substantially parallel to the (100) surface. Masked anisotropic wet etching (e.g., selectivity on the order of 100:1 or 200:1 for etching, with hot, aqueous KOH, the (100) surface of single-crystal silicon relative to the various {111} surfaces) yields faces of the 4-faced and 3-faced depressions 20, 30, 40, and 66 that form obtuse angles of 125.3° (i.e., 180° minus 54.7°) with respect to the bottom surface 16 of the submount 10 (which is substantially parallel to the surface 92 of wafer 90). The 4-faced depression 20 is about 100-200 μm wide at its opening and is substantially square. The 4-faced depressions 66 are about 10-30 μm wide at their openings and the intervening areas 68 are about 5-15 ∞m wide. Those values represent only one combination among many suitable combinations that can be employed in widely varying implementations; any suitable combination of materials and dimensions can be employed within the scope of the present disclosure or appended claims.

Exemplary apparatus and methods encompassed by the present disclosure include, but are not limited to, the following examples:

EXAMPLE 1

An apparatus comprising an optical submount formed from a volume of semiconductor or dielectric material that is substantially transparent over an operational wavelength range, wherein: (a) a bottom surface of the submount includes a first 3-faced depression at a forward edge of the bottom submount surface and a 4-faced depression; (b) the submount is arranged to direct or transmit a portion of an optical signal to propagate within the volume of semiconductor or dielectric material between a transmission area of a rearward face of the first 3-faced depression and a transmission area of a top surface of the submount with the optical signal being at least partly internally reflected by a forward face of the 4-faced depression; (c) the 4-faced depression is substantially circumscribed by one or more substantially flat, substantially horizontal, substantially coplanar areas of the bottom submount surface; and (d) the 4-faced depression is separated from the first 3-faced depression by one of the one or more substantially flat, substantially horizontal, substantially coplanar areas of the bottom submount surface.

EXAMPLE 2

The apparatus of Example 1 wherein the bottom surface of the submount includes a second 3-faced depression at a rearward edge of the bottom submount surface, the 4-faced depression is separated from the second 3-faced depression by one of the one or more substantially flat, substantially horizontal, substantially coplanar areas of the bottom submount surface, and the 4-faced depression is positioned between the first and second 3-faced depressions.

EXAMPLE 3

The apparatus of any one of Examples 1 or 2 wherein the semiconductor or dielectric material comprises a crystalline material, and wherein each face of each one of the 4-faced and 3-faced depressions substantially coincides with a corresponding crystal plane of the crystalline material.

EXAMPLE 4

The apparatus of any one of Examples 1-3 wherein the semiconductor or dielectric material comprises a crystalline material, and the one or more substantially flat, substantially horizontal, substantially coplanar areas of the bottom submount surface substantially coincide with a corresponding crystal plane of the crystalline material.

EXAMPLE 5

The apparatus of any one of Examples 1-4 wherein at least a portion of at least one of the one or more substantially flat, substantially horizontal, substantially coplanar areas of the bottom submount surface includes a metal coating.

EXAMPLE 6

The apparatus of any one of Examples 1-5 further comprising one or more contact areas on the top submount surface that are arranged for attaching a photodetector to the top submount surface in a position that enables the photodetector to receive a transmitted portion of the optical signal that exits the submount through the transmission area of the top submount surface.

EXAMPLE 7

The apparatus of any one of Examples 1-6 further comprising a photodetector attached to the top submount surface in a position that enables the photodetector to receive a portion of an optical signal that enters the optical submount through the transmission area of the rearward face of the first 3-faced depression, is internally reflected from the forward face of the 4-faced depression, and exits the optical submount through the transmission area of the top submount surface.

EXAMPLE 8

The apparatus of any one of Examples 1-7 wherein the semiconductor or dielectric material is a semiconductor material.

EXAMPLE 9

The apparatus of Example 8 wherein the semiconductor material comprises a doped or undoped Group IV semiconductor, a doped or undoped III-V semiconductor, or a doped or undoped II-VI semiconductor.

EXAMPLE 10

The apparatus of Example 8 wherein the semiconductor material is doped or undoped silicon.

EXAMPLE 11

The apparatus of any one of Examples 1-10 wherein the operational wavelength range is between about 1.2 µm and about 1.7 µm.

EXAMPLE 12

The apparatus of any one of Examples 1-7 wherein the semiconductor or dielectric material is a dielectric material.

EXAMPLE 13

The apparatus of Example 12 wherein the dielectric material comprises (i) a glassy material, (ii) a crystalline material, (iii) a ceramic material, (iv) a metal oxide, nitride, or oxynitride, or (v) a semiconductor oxide, nitride, or oxynitride.

EXAMPLE 14

The apparatus of Claim any one of Examples 1-7, 12 or 13 wherein the operational wavelength range extends from about 0.4 µm to about 2 µm.

EXAMPLE 15

The apparatus of any one of Examples 1-14 wherein the transmission area of the top submount surface includes a dielectric anti-reflection layer formed thereon.

EXAMPLE 16

The apparatus of Example 15 wherein the dielectric anti-reflection layer comprises silicon nitride or silicon oxynitride.

EXAMPLE 17

The apparatus any one of Examples 15 or 16 wherein the dielectric anti-reflection layer is a single quarter-wave layer for a selected wavelength within the operational wavelength range.

EXAMPLE 18

The apparatus any one of Examples 15-17 wherein the dielectric anti-reflection layer is between about 100 nm and about 300 nm thick.

EXAMPLE 19

The apparatus of any one of Examples 1-18 wherein: (e) the bottom submount surface includes one or more sets of 4-faced depressions, each set comprising two or more adjacent 4-faced depressions and one or more intervening substantially flat, substantially horizontal, substantially coplanar areas of the bottom submount surface; and (f) the intervening areas of each set form a corresponding alignment mark arranged for positioning the optical submount on a substrate.

EXAMPLE 20

The apparatus of Example 19 wherein each set of 4-faced depressions and intervening areas includes a metal coating.

EXAMPLE 21

The apparatus of any one of Examples 19 or 20 wherein each set comprises (i) four 4-faced depressions in a rectangular arrangement and (ii) four intervening areas of the bottom submount surface that form a corresponding cross-shaped alignment mark:

EXAMPLE 22

The apparatus of any one of Examples 19 or 20 wherein each array comprises (i) three 4-faced depressions and (ii) two intervening areas of the bottom submount surface that form a corresponding L-shaped or T-shaped alignment mark.

EXAMPLE 23

The apparatus of any one of Examples 19 or 20 wherein each array comprises (i) two 4-faced depressions and (ii) one intervening area of the bottom submount surface that forms a corresponding linear alignment mark.

EXAMPLE 24

The apparatus of any one of Examples 19-23 wherein the semiconductor or dielectric material comprises a crystalline material, and wherein each face of each one of the 4-faced depressions of each set substantially coincides with a corresponding crystal plane of the crystalline material.

EXAMPLE 25

A method for making the optical submount of any one of Examples 1-24 the method comprising: (a) forming on the bottom submount surface the 4-faced depression; and (b) forming at the forward edge of on the bottom submount surface the first 3-faced depression.

EXAMPLE 26

The method of Example 25 further comprising forming at the rearward edge of the bottom submount surface the second 3-faced depression, wherein the 4-faced depression is separated from the second 3-faced depression by one of the one or more substantially flat, substantially horizontal, substantially coplanar areas of the bottom submount surface, and wherein the 4-faced depression is positioned between the first and second 3-faced depressions.

EXAMPLE 27

The method of any one of Example 25 or 26 wherein: (i) the semiconductor or dielectric material comprises a crystalline material; (ii) forming the 4-faced and 3-faced depression comprises masked, anisotropic wet etching; (iii) each face of each one of the 4-faced and 3-faced depressions substantially coincides with a corresponding crystal plane of the crystalline material; and (iv) the one or more substantially flat, substantially horizontal, substantially coplanar areas of the bottom submount surface substantially coincide with a corresponding crystal plane of the crystalline material.

EXAMPLE 28

The method of any one of Examples 25-27, the method further comprising forming on the bottom submount surface the one or more sets of 4-faced depressions.

EXAMPLE 29

The method of Example 28 wherein: (i) the optical element comprises a crystalline material; (ii) forming the one or more sets of 4-faced depressions comprises masked, anisotropic wet etching; (iii) each face of each one of the 4-faced depressions of each set substantially coincides with a corresponding crystal plane of the crystalline material; and (iv) each one of the intervening areas of each set substantially coincides with a corresponding crystal plane of the crystalline material.

EXAMPLE 30

A method for making a multitude of optical submounts of any one of Examples 1-24, the method comprising: (a) forming on a first surface of a wafer an array of 4-faced depressions arranged in multiple substantially parallel rows; and (b) dividing the wafer into the multitude of optical submounts along two or more sets of substantially parallel cut lines, wherein: (c) the cut lines are arranged to avoid certain rows of the array of 4-faced depressions so that at least one 4-faced depression of the array remains on each one of the multitude of submounts; and (d) the cut lines are arranged so as to intersect certain rows of the array of 4-faced depressions so as to leave the corresponding 3-faced depression at the forward edge of each one of the multitude of submounts.

EXAMPLE 31

The method of Example 30 the cut lines are arranged so as to intersect certain rows of the array of 4-faced depressions so as to leave a corresponding 3-faced depression at the rearward edge of each one of the multitude of submounts.

EXAMPLE 32

The method of Example 31 wherein the cut lines are arranged so that each 4-faced depression of the intersected rows of the array is divided into a 3-faced depression on the forward edge of a corresponding submount divided from the wafer and a 3-faced depression on the rearward edge of an adjacent submount divided from the wafer.

EXAMPLE 33

The method of any one of Example 30-32 wherein: (i) the wafer comprises a crystalline material; (ii) forming the array of 4-faced comprises masked, anisotropic wet etching of a first surface of the wafer; (iii) each face of each one of the 4-faced and 3-faced depressions substantially coincides with a corresponding crystal plane of the crystalline material; and (iv) the one or more substantially flat, substantially horizontal, substantially coplanar areas of the bottom submount surface substantially coincide with a corresponding crystal plane of the crystalline material that is substantially parallel to the first wafer surface.

EXAMPLE 34

A method for using the optical submount of any one of Examples 19-24, the method comprising: (a) using a pickup tool of a die bonder, engaging the optical submount; (b) using a visual alignment system, visualizing the alignment mark on the optical submount and a corresponding alignment mark on a substrate; (c) using the die bonder, positioning the optical submount engaged with the pickup tool at an attachment location on the substrate so that the alignment mark on the optical submount is visually aligned with the corresponding alignment mark on the substrate; (d) securing the optical submount to the substrate at the attachment location; and (e) disengaging the pickup tool from the optical submount.

EXAMPLE 35

An apparatus comprising a first optical element arranged to be attached to a second optical element with an engagement surface of the first optical element on a corresponding engagement surface of the second optical element, wherein: (a) the first optical element. engagement surface includes one or more sets of 4-faced depressions, each set comprising two or more adjacent 4-faced depressions and one or more intervening substantially flat, substantially horizontal, substantially coplanar areas of the first optical element engagement surface; and (b) the intervening areas of each set form a corresponding alignment mark arranged for positioning the first optical element on the second optical element.

EXAMPLE 36

The apparatus of Example 35 wherein each set of 4-faced depressions and intervening areas includes a metal coating.

EXAMPLE 37

The apparatus of any one of Examples 35 or 36 wherein each set comprises (i) four 4-faced depressions in a rectangular arrangement and (ii) four intervening areas of the bottom submount surface that form a corresponding cross-shaped alignment mark.

EXAMPLE 38

The apparatus of any one of Examples 35 or 36 wherein each set comprises (i) three 4-faced depressions and (ii) two intervening areas of the bottom submount surface that form a corresponding L-shaped or T-shaped alignment mark.

EXAMPLE 39

The apparatus of any one of Examples 35 or 36 wherein each array comprises (i) two 4-faced depressions and (ii) one intervening area of the bottom submount surface that forms a corresponding linear alignment mark.

EXAMPLE 40

The apparatus of any one of Examples 35-39 wherein: the first optical element comprises a crystalline material, each face of each one of the 4-faced depressions of each set substantially coincides with a corresponding crystal plane of the crystalline material, and each one of the intervening areas of each set substantially coincides with a corresponding crystal plane of the crystalline material.

EXAMPLE 41

The apparatus of any of Examples 35-40 wherein the optical element comprises an optical submount.

EXAMPLE 42

A method for making the optical element of any one of Examples 35-41, the method comprising forming on the engagement surface of the first optical element the one or more sets of 4-faced depressions.

EXAMPLE 43

The method of claim 42 further comprising forming a metal coating on each one of the one or more sets of 4-faced depressions.

EXAMPLE 44

The method of any one of Examples 42 or 43 wherein: (i) the optical element comprises a crystalline material; (ii) forming the one or more sets of 4-faced depressions comprises masked, anisotropic wet etching; (iii) each face of each one of the 4-faced depressions of each set substantially coincides with .a corresponding crystal plane of the crystalline material; and (iv) each one of the intervening areas of each set substantially coincides with a corresponding crystal plane of the crystalline material.

EXAMPLE 45

A method for using the optical element of any one of Examples 35-41, the method comprising: (a) using a pickup tool of a die bonder, engaging the first optical element; (b) using a visual alignment system, visualizing the alignment mark on the first optical element and a corresponding alignment mark on the second optical element; (c) using the die bonder, positioning the first optical element engaged with the pickup tool at an attachment location on the second optical element so that the alignment mark on the first optical element is visually aligned with the corresponding alignment mark on the second optical element; (d) securing the first optical element to the second optical element at the attachment location; and (e) disengaging the pickup tool from the first optical element.

EXAMPLE 46

A method for using the optical element of any one of Examples 35-41, the method comprising: (a) using a pickup tool of a die bonder, engaging the second optical element; (b) using a visual alignment system, visualizing the alignment mark on the first optical element and a corresponding alignment mark on the second optical element; (c) using the die bonder, positioning the second optical element engaged with the pickup tool at an attachment location on the first optical element so that the alignment mark on the first optical element is visually aligned with the corresponding alignment mark on the second optical element; (d) securing the second optical element to the first optical element at the attachment location; and (e) disengaging the pickup tool from the second optical element.

It is intended that equivalents of the disclosed exemplary embodiments and methods shall fall within the scope of the present disclosure or appended claims. It is intended that the disclosed exemplary embodiments and methods, and equivalents thereof, may be modified while remaining within the scope of the present disclosure or appended claims.

In the foregoing Detailed Description, various features may be grouped together in several exemplary embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed exemplary embodiment. Thus, the appended claims are hereby incorporated into the Detailed Description, with each claim standing on its own as a separate disclosed embodiment. However, the present disclosure shall also be construed as implicitly disclosing any embodiment having any suitable set of one or more disclosed or claimed features (i.e., sets of features that are not incompatible or mutually exclusive) that appear in the present disclosure or the appended claims, including those sets that may not be explicitly disclosed herein. It should be further noted that the scope of the appended claims do not necessarily encompass the whole of the subject matter disclosed herein.

For purposes of the present disclosure and/appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure or appended claims, the words "comprising," "including," "having," and variants thereof, wherever they appear, shall be construed as open ended terminology, with the same meaning as if the phrase "at least" were appended after each instance thereof.

In the appended claims, if the provisions of 35 USC §112 ¶6 are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC §112 ¶6 are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. An apparatus comprising an optical submount formed from a volume of semiconductor or dielectric material that is substantially transparent over an operational wavelength range, wherein:

(a) a bottom surface of the submount includes a first 3-faced depression at a forward edge of the bottom submount surface and a 4-faced depression;

(b) the submount is arranged to direct or transmit a portion of an optical signal to propagate within the volume of semiconductor or dielectric material between a transmission area of a rearward face of the first 3-faced depression and a transmission area of a top surface of the submount with the optical signal being at least partly internally reflected by a forward face of the 4-faced depression;

(c) the 4-faced depression is substantially circumscribed by one or more substantially flat, substantially horizontal, substantially coplanar areas of the bottom submount surface; and (d) the 4-faced depression is separated from the first 3-faced depression by one of the one or more substantially flat, substantially horizontal, substantially coplanar areas of the bottom submount surface.

2. The apparatus of claim 1 wherein the bottom surface of the submount includes a second 3-faced depression at a rearward edge of the bottom submount surface, the 4-faced depression is separated from the second 3-faced depression by one of the one or more substantially flat, substantially horizontal, substantially coplanar areas of the bottom submount surface, and the 4-faced depression is positioned between the first and second 3-faced depressions.

3. The apparatus of claim 1 wherein the semiconductor or dielectric material comprises a crystalline material, and wherein one or more faces of one or more of the 4-faced and 3-faced depressions substantially coincides with a corresponding crystal plane of the crystalline material.

4. The apparatus of claim 1 wherein the semiconductor or dielectric material comprises a crystalline material, and the one or more substantially flat, substantially horizontal, substantially coplanar areas of the bottom submount surface substantially coincide with a corresponding crystal plane of the crystalline material.

5. The apparatus of claim 1 wherein at least a portion of at least one of the one or more substantially flat, substantially horizontal, substantially coplanar areas of the bottom submount surface includes a metal coating.

6. The apparatus of claim 1 further comprising one or more contact areas on the top submount surface that are arranged for attaching a photodetector to the top submount surface in a position that enables the photodetector to receive a transmitted portion of the optical signal that exits the submount through the transmission area of the top submount surface.

7. The apparatus of claim 1 wherein the transmission area of the top submount surface includes a dielectric anti-reflection layer formed thereon.

8. The apparatus of claim 1 further comprising a photodetector attached to the top submount surface in a position that enables the photodetector to receive a portion of an optical signal that enters the optical submount through the transmission area of the rearward face of the first 3-faced depression, is internally reflected from the forward face of the 4-faced depression, and exits the optical submount through the transmission area of the top submount surface.

9. The apparatus of claim 1 wherein the semiconductor or dielectric material is a semiconductor material.

10. The apparatus of claim 9 wherein the semiconductor material comprises a doped or undoped Group IV semiconductor, a doped or undoped III-V semiconductor, or a doped or undoped II-VI semiconductor.

11. The apparatus of claim 9 wherein the semiconductor material is doped or undoped silicon.

12. The apparatus of claim 9 wherein the operational wavelength range is between about 1.2 μm and about 1.7 μm.

13. The apparatus of claim 1 wherein the semiconductor or dielectric material is a dielectric material.

14. The apparatus of claim 1 wherein:
(e) the bottom submount surface includes one or more sets of 4-faced depressions, each set comprising two or more adjacent 4-faced depressions and one or more intervening substantially flat, substantially horizontal, substantially coplanar areas of the bottom submount surface; and
(f) the intervening areas of each set form a corresponding alignment mark arranged for positioning the optical submount on a substrate.

15. The apparatus of claim 14 wherein one or more sets of 4-faced depressions and intervening areas include a metal coating.

16. The apparatus of claim 14 wherein one or more sets comprise (i) four 4-faced depressions in a rectangular arrangement and (ii) four intervening areas of the bottom submount surface that form a corresponding cross-shaped alignment mark.

17. The apparatus of claim 14 wherein one or more sets comprise (i) three 4-faced depressions and (ii) two intervening areas of the bottom submount surface that form a corresponding L-shaped or T-shaped alignment mark.

18. The apparatus of claim 14 wherein one or more sets comprise (i) two 4-faced depressions and (ii) one intervening area of the bottom submount surface that forms a corresponding linear alignment mark.

19. The apparatus of claim 14 wherein the semiconductor or dielectric material comprises a crystalline material, and wherein one or more faces of one or more 4-faced depressions of one or more sets substantially coincides with a corresponding crystal plane of the crystalline material.

20. An apparatus comprising a first optical element arranged to be attached to a second optical element with an engagement surface of the first optical element on a corresponding engagement surface of the second optical element, wherein:
(a) the first optical element engagement surface includes one or more sets of 4-faced depressions, each set comprising two or more adjacent 4-faced depressions and one or more intervening substantially flat, substantially horizontal, substantially coplanar areas of the first optical element engagement surface; and
(b) the intervening areas of each set form a corresponding alignment mark arranged for positioning the first optical element on the second optical element.

21. The apparatus of claim 20 wherein one or more sets of 4-faced depressions and intervening areas include a metal coating.

22. The apparatus of claim 20 wherein one or more sets comprise (i) four 4-faced depressions in a rectangular arrangement and (ii) four intervening areas of the bottom submount surface that form a corresponding cross-shaped alignment mark.

23. The apparatus of claim 20 wherein one or more sets comprises (i) three 4-faced depressions and (ii) two intervening areas of the bottom submount surface that form a corresponding L-shaped or T-shaped alignment mark.

24. The apparatus of claim 20 wherein one or more sets comprise (i) two 4-faced depressions and (ii) one intervening area of the bottom submount surface that forms a corresponding linear alignment mark.

25. The apparatus of claim 20 wherein: the first optical element comprises a crystalline material, and wherein: (i) one or more faces of one or more 4-faced depressions of one or more sets substantially coincides with a corresponding crystal plane of the crystalline material, or (ii) each one of the intervening areas of each set substantially coincides with a corresponding crystal plane of the crystalline material.

26. The apparatus of claim 20 wherein the optical element comprises an optical submount.

27. The apparatus of claim 9 wherein the semiconductor material comprises a crystalline material, and wherein: (i) one or more faces of one or more of the 4-faced and 3-faced depressions substantially coincides with a corresponding crystal plane of the crystalline material; or (ii) the one or more substantially flat, substantially horizontal, substantially coplanar areas of the bottom submount surface substantially coincide with a corresponding crystal plane of the crystalline material.

28. The apparatus of claim 13 wherein the dielectric material comprises a crystalline material, and wherein: (i) one or more faces of one or more of the 4-faced and 3-faced depressions substantially coincides with a corresponding crystal plane of the crystalline material; or (ii) the one or more substantially flat, substantially horizontal, substantially coplanar areas of the bottom submount surface substantially coincide with a corresponding crystal plane of the crystalline material.

29. The apparatus of claim 16 wherein one or more sets of 4-faced depressions and corresponding one or more cross-shaped alignment marks include a metal coating.

30. The apparatus of claim 22 wherein one or more sets of 4-faced depressions and corresponding one or more cross-shaped alignment marks include a metal coating.

* * * * *